(12) United States Patent
Hashimoto et al.

(10) Patent No.: US 7,202,549 B2
(45) Date of Patent: Apr. 10, 2007

(54) SEMICONDUCTOR DEVICE HAVING THIN FILM RESISTOR PROTECTED FROM OXIDATION

(75) Inventors: Yasunori Hashimoto, Hyougo-ken (JP); Kimihiko Yamashita, Hyougo-ken (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/848,384

(22) Filed: May 19, 2004

(65) Prior Publication Data

US 2004/0238920 A1   Dec. 2, 2004

(30) Foreign Application Priority Data

May 27, 2003   (JP)   ............... 2003-148807

(51) Int. Cl.
*H01L 29/00*   (2006.01)
(52) U.S. Cl. ............ 257/536; 257/537; 257/350; 257/351; 257/358; 257/360; 257/363; 257/379
(58) Field of Classification Search ............ 257/536, 257/537, 701, 706, 350, 351, 358, 360, 363, 257/379, 516, 533
See application file for complete search history.

(56) References Cited

U.S. PATENT DOCUMENTS

| | | | | |
|---|---|---|---|---|
| 5,525,834 A | * | 6/1996 | Fischer et al. | ............... 257/691 |
| 5,592,006 A | * | 1/1997 | Merrill | ............... 257/337 |
| 6,532,027 B2 | * | 3/2003 | Ozaki et al. | ............... 347/64 |
| 6,642,585 B2 | * | 11/2003 | Ohuchi et al. | ............... 257/388 |
| 6,888,232 B2 | * | 5/2005 | Eldridge et al. | ............... 257/682 |

FOREIGN PATENT DOCUMENTS

| | | |
|---|---|---|
| JP | 07-202124 | 8/1995 |
| JP | 11-044485 | 2/1999 |
| JP | 11-142527 | 5/1999 |
| JP | 2001-110895 | 4/2001 |
| JP | 2002-094075 | 3/2002 |
| KR | 1020010047930 | 2/2002 |

* cited by examiner

*Primary Examiner*—Evan Pert
*Assistant Examiner*—Tan Tran
(74) *Attorney, Agent, or Firm*—Dickstein Shapiro LLP

(57) ABSTRACT

A semiconductor device, a method for manufacturing the semiconductor device, and an integrated circuit including the semiconductor device are disclosed. The semiconductor device includes a substrate section, a resistor formed on the substrate section, a metal pattern formed on the resistor, an oxide pattern formed on the metal pattern, and a protective film covering the resistor, the metal pattern and the oxide pattern. With this structure, the metal pattern sufficiently prevents formation of an oxide film on a surface of the resistor even when dry ashing or dry etching is performed in the manufacturing process.

15 Claims, 8 Drawing Sheets

SEMICONDUCTOR DEVICE HAVING THIN FILM RESISTOR PROTECTED FROM OXIDATION

CROSS-REFERENCE TO RELATED APPLICATIONS

This application claims priority to Japanese patent application, No. JPAP2003-148807 filed on May 27, 2003, in the Japanese Patent Office, the entire contents of which are incorporated by reference herein.

BACKGROUND OF THE INVENTION

1. Field of the Invention

The present invention relates to a semiconductor device, a method for manufacturing the semiconductor device, and an integrated circuit including the semiconductor device. More particularly, the present invention relates to a semiconductor device having a thin film resistor, a method for manufacturing the semiconductor device including a thin film resistor, and an integrated circuit including the semiconductor device including a thin film resistor.

2. Brief Description of Related Art

In manufacturing an integrated circuit, an active region including a transistor or a diode and a passive region including a resistor or a capacitor are generally formed on a semiconductor substrate before forming a wiring layer thereon.

As for the resistor, a metal thin film, made of NiCr (nickel chrome), TaN (tantalum nitride), $CrSi_2$ (chromium silicide), CrSiN (chromium silicon nitride), CrSi (chromium silicon), or CrSiO (chrome silicon oxide), for example, is widely used for high feature resolution and circuit miniaturization.

FIG. 1D illustrates a section of a conventional semiconductor device 1 including a thin film resistor 5. The conventional semiconductor device 1 additionally includes a substrate 2, an underlying insulating film 3, and an interlaying insulating film 11. The thin film resistor 5 is usually manufactured in three main steps including photolithography (FIG. 1A), etching (FIG. 1B), and ashing (FIG. 1C).

The photolithography step of FIG. 1A deposits a photoresist 12 on a resistor material 4, and places a mask (not shown) over the surface of the photoresist 12 for pattern definition. Thus, after being exposed to radiation, such as ultraviolet light, only a selected area of the photoresist 12 remains as a photoresist pattern 13, as shown in FIG. 1B. Next, the etching step of FIG. 1B etches the resistor material 4 by using the photoresist pattern 13 as an etching mask to form the thin film resistor 5. The ashing step of FIG. 1C removes the photoresist mask 13. The interlayer insulating film 11 is then formed so as to protect the thin film resistor 5, and the manufacturing process ends.

Recently, in the ashing step of FIG. 1B, dry ashing, such as plasma ashing using plasma-containing oxygen, is preferably used. However, applying the oxygen plasma may form an oxide film on the surface of the thin film resistor 5, resulting in variation in the resistance value.

BRIEF SUMMARY OF THE INVENTION

The present invention provides a semiconductor device including a substrate section, a resistor formed on the substrate section, a metal pattern formed on the resistor, an oxide pattern formed on the metal pattern, and a protective film covering the resistor, the metal pattern and the oxide pattern. In this case, the metal pattern sufficiently prevents formation of an oxide film between the upper surface of the resistor and the bottom surface of the metal pattern.

The protective film may sufficiently prevent formation of an oxide film between the side surface of the resistor and the corresponding surface of the protective film.

Further, the substrate section may preferably include a silicon substrate coated with a silicon oxide film. The resistor may preferably include a thin film made of a material selected from NiCr, TaN, $CrSi_2$, CrSiN, CrSi and CrSiO. The metal pattern may preferably include an SiN thin film. The oxide pattern may preferably include a silicon oxide thin film. The protective film may preferably include a plasma nitride film.

Furthermore, the metal pattern may have a horizontal width substantially equal to a horizontal width of the resistor. In this case, the oxide pattern may have a horizontal width slightly larger than the horizontal width of the metal pattern.

The above semiconductor device may further include a side wall section provided between the side surface of the oxide pattern and the corresponding surface of the protective film. In this case, the side wall section may preferably include a silicon oxide thin film. Alternatively, the side wall section may preferably include an amorphous silicon thin film.

The present invention also provides an integrated circuit including a substrate section, a resistor section formed on the substrate section and including a plurality of resistors connected to one another in series and configured to generate different resistance values, a metal pattern formed on the resistor, an oxide pattern formed on the metal pattern, a protective film covering the resistor, the metal pattern and the oxide pattern, and a fusing element section including a plurality of fusing elements each connected in parallel to one of the plurality of resistors. In this case, the metal pattern sufficiently prevents formation of an oxide film between the upper surface of the resistor and the bottom surface of the metal pattern.

The above integrated circuit may further include a reference voltage generator configured to generate a reference voltage, a comparator configured to receive the reference voltage from the reference voltage generator and a divided voltage from the resistor section, a transistor configured to receive an output voltage from the comparator, and an output terminal configured to output the output voltage received from the transistor. In this case, the output voltage is controlled based on the divided voltage.

In another embodiment, the above integrated circuit may further include an input terminal configured to provide a detected voltage to the resistor section, a reference voltage generator configured to generate a reference voltage, a comparator configured to receive the reference voltage from the reference voltage generator and a divided voltage from the resistor section, and an output terminal configured to output an output voltage received from the comparator. In this case, the output voltage is controlled based on the divided voltage.

The present invention also provides a method for manufacturing a semiconductor device including the steps of providing, coating, first forming, placing, first patterning, removing, second patterning, third patterning, and covering. The providing step provides a substrate. The coating step coats the substrate with an underlying insulating layer. The first forming step forms a resistor material on the underlying insulating layer. The second forming step forms a metal film on the resistor material. The third forming steps forms an oxide film on the metal film. The placing step places a photoresist pattern on the oxide film. The first patterning step patterns the oxide film into an oxide pattern using the photoresist pattern as a mask. The removing step removes the photoresist pattern. The second patterning patterns the metal film into a metal pattern using the oxide pattern as a mask. The third patterning step patterns the resister material into a resistor using the oxide pattern as a mask. The covering step covers the oxide pattern, the metal pattern, and the resistor with a protective film.

The above method may further include a fourth forming step and a fourth patterning step. The fourth forming step forms a second metal film covering the oxide metal film and the first metal film after the removing step. The fourth patterning step patterns the second metal film into a side wall section. In this case, the second patterning step and the third patterning step additionally use the side wall section as a mask.

Further, the coating step may preferably use a CVD (chemical vapor deposition) method. The first forming step may preferably use a sputtering method. The second forming step may preferably use a CVD method. The third forming step may preferably use a CVD method. The first patterning step may preferably use a chemical dry etching method. The removing step may preferably use a plasma ashing method. The second patterning step may preferably use a chemical dry etching method or an isotropic method. The third patterning step may preferably use a chemical dry etching method or an isotropic method. The covering step may preferably use a CVD method. The fourth forming step may preferably use a CVD method. The fourth patterning step may preferably use a chemical dry etching method.

BRIEF DESCRIPTION OF THE DRAWINGS

A more complete appreciation of the disclosure and many of the attendant advantages thereof will be readily obtained as the same become better understood by reference to the following detailed description when considered in connection with the accompanying drawings, wherein.

DETAILED DESCRIPTION OF THE INVENTION

Figure 1A:
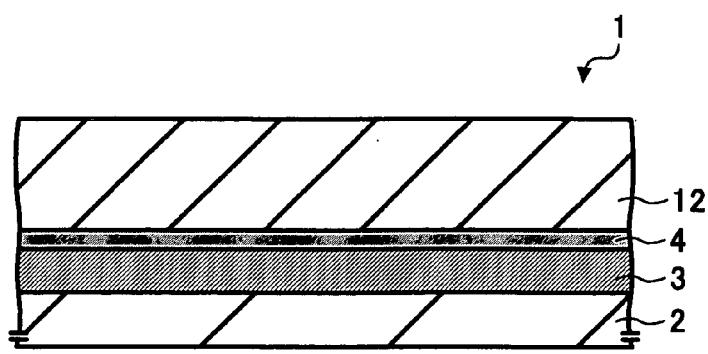
FIGS. 1A to 1D are cross-sectional views illustrating partial steps in a method for manufacturing a conventional semiconductor device in a stepwise manner.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, preferred embodiments of the present invention are explained.

Figure 2A:
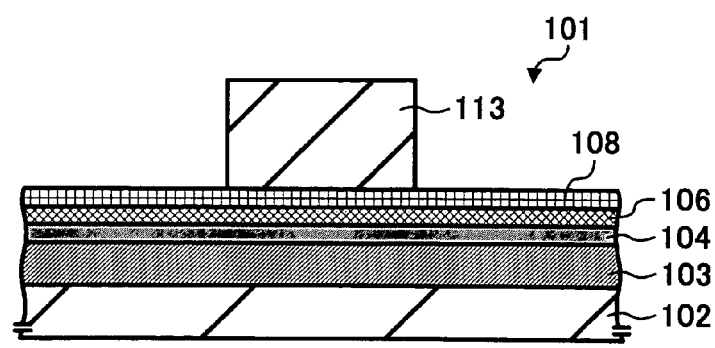
FIGS. 2A to 2E are cross-sectional views illustrating partial steps in a method for manufacturing a semiconductor device in a stepwise manner according to a first preferred embodiment of the present invention.
Figure 2B:
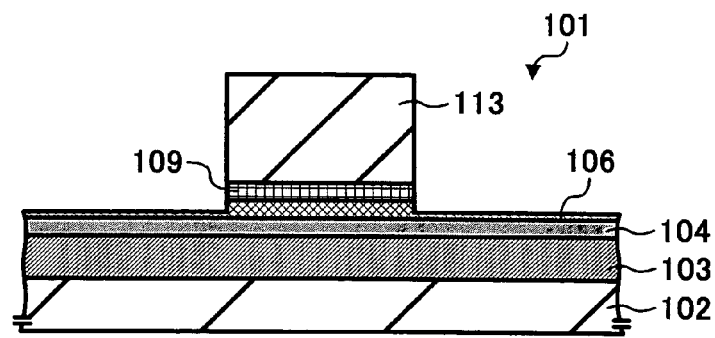
Figure 2C:
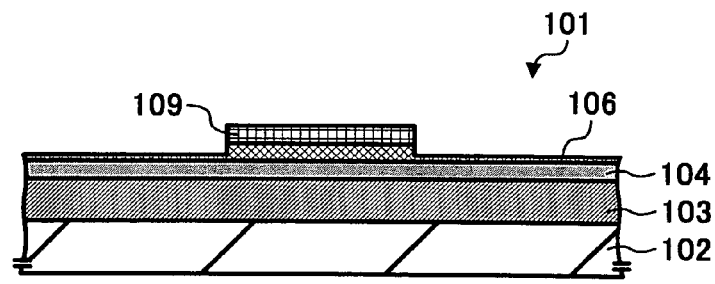
Figure 2D:
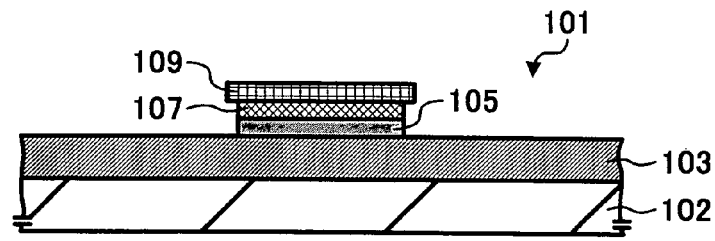
Figure 2E:
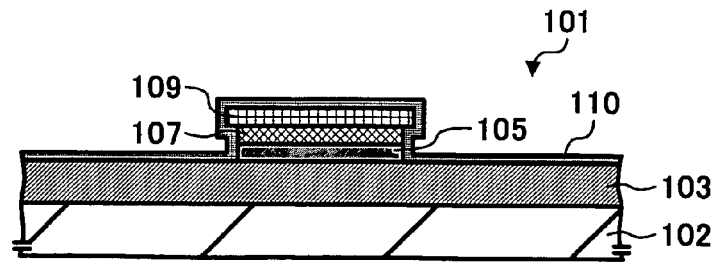

FIG. 2E illustrates a section of a semiconductor device 101 including a thin film resistor 105 according to a first embodiment of the present invention. In addition to the thin film resistor 105, the semiconductor device 101 includes other components, such as a MOSFET (metal oxide semiconductor field-effect transistor), however, a detailed description thereof is omitted herein.

In FIG. 2E, the semiconductor device 101 includes a substrate 102, an underlying insulating film 103, the thin film resistor 105, a metal pattern 107, an oxide pattern 109, and a protective film 110.

The substrate 102 is made from a preform of a semiconductor material such as Si (silicon), Ge (germanium), GaAs (gallium arsenide), etc. In particular, Si is preferably used in this example. The underlying insulating film 103, placed on the substrate 102, is preferably a silicon oxide film, however, it may be formed of an SiN (silicon nitride) film or a thermal oxidation film. The thin film resistor 105, placed on the underlying insulating film 103, is a thin film made of metal such as NiCr, TaN, $CrSi_2$, CrSiN, CrSi, or CrSiO. In this example, CrSi is preferably used. The metal pattern 107, preferably formed of a SiN film and having a horizontal width (as related to the drawings) similar to the horizontal width of the thin film resistor 105, is formed on the thin film resistor 105. In this case, an oxide film is not formed, at least not substantially, between the upper surface of the thin film resistor 105 and the bottom surface of the metal pattern 107. The oxide pattern 109, preferably formed of an SiO (silicon oxide) film and having a horizontal width slightly larger than the horizontal width of the metal pattern 107 (i.e., the thin film resistor 105), is formed on the metal pattern 107. The protective film 110, preferably made of a plasma nitride film, is deposited on the underlying insulating film 103 so as to cover the side surfaces of the thin film resistor 105, the side surfaces of the metal pattern 107, and the oxide pattern 109. In this case, an oxide film is not formed, at least not substantially, between the side surfaces of the thin film resistor 105 and the protective film 110.

With this structure, since an oxide film is not formed on the surface of the thin film resister 105, the semiconductor device of FIG. 2E can provide a consistent resistance value.

Next, a method for manufacturing the thin film resistor 105 of the semiconductor device 101 is explained with reference to FIGS. 2A to 2E.

In a step illustrated in FIG. 2A, after the substrate 102 is prepared, the underlying insulating film 103 having a thickness of about 8000 Å is formed on the surface of the substrate 102 by a CVD method, a thermal oxidation method, or the like. In this example, the CVD method is preferably used.

A resistor material 104 is deposited on the insulating film 103 by a sputtering method, the CVD method, and the like to have a thickness of about 100 Å. In this example, the sputtering method is preferably applied using Ar (argon) ions.

A first metal film 106 and an oxide film 108 are deposited on the resistor material 104 in this order by the CVD method to each have a thickness of about 500 Å, for example. Alternatively, the first metal film 106 may be formed by the sputtering method, or the oxide film may be formed by thermal oxidation.

Next, a photoresist (not shown) is applied to the oxide film 108, and a mask is placed thereon so as to form a photoresist pattern 113 in a similar manner as described above referring to FIG. 1A.

In a second step illustrated in FIG. 2B, the photoresist pattern 113 is then used as an etching mask to pattern the oxide film 108 to form the oxide pattern 109. In this example, chemical dry etching is applied using, for example, a mixed gas including $CF_4$ and $CHF_3$. Further, in this etching, over-etching of nearly 50% of the thickness of the oxide film 108 is performed to guarantee the complete removal of the oxide film 108. As a result, an upper portion of the first metal film 106 is also removed. In other words, the first metal film 106 functions as an etch stop such that it preferably has a thickness large enough to withstand the over-etching. For example, the first metal film 106 has a thickness 30% larger than the thickness of the oxide film 108.

Figure 1B:
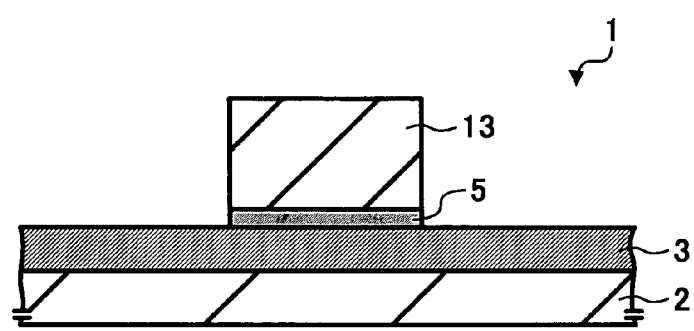
Figure 1C:
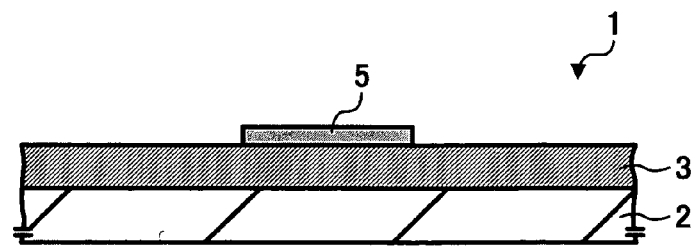
Figure 1D:
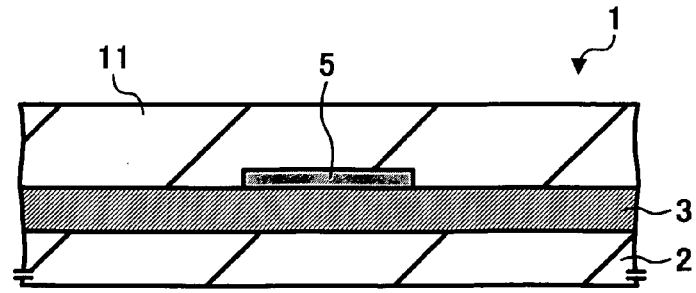

Next, in a step illustrated in FIG. 2C, plasma ashing is applied, in a similar manner as described above referring to FIG. 1B, to remove the photoresist pattern 113. At this time, the surface of the resistor material 104 is protected by the first metal film 106 thereon such that an oxide film is not formed on the resistor material 104.

Subsequently, in a step illustrated in FIG. 2D, chemical dry etching is applied to the first metal film 106 and the resistor material 104 by using, for example, a mixed gas including $CF_4$ and oxygen as etchant. Specifically, the first metal film 106 and the resistor material 104 are sequentially patterned by using the oxide pattern 109 as an etching mask to form the metal pattern 107 and the thin film resistor 105. In this example, the etching is performed by a chemical dry etcher, for example, under a condition of microwave power of 600 W, pressure of 90 Pa, $CF_4$ gas flow rate of 400 sccm (standard cc/minute), and oxygen gas flow rate of 100 sccm.

Further, the chemical dry etcher performs the etching at a slower etch rate such that the oxide pattern 109 can sufficiently withstand a side etch effect caused due to the chemical dry etching. Thus, the oxide pattern 109 has a horizontal width larger than the horizontal width of the metal pattern 107 or the thin film resistor 105.

Alternatively, the first metal film 106 may be patterned first by the above-described chemical dry etching method to form the metal pattern 107. Then, the resistor material 104 may be patterned by an isotropic method, such as an RIE (reactive ion etching) method or the sputtering method, to form the thin film resistor 105. This alternative method is effective especially when an oxide film is naturally formed on the resistor material 104, which makes it difficult to apply the chemical dry etching to the resistor material 104. Further, this alternative method, since it is isotropic, protects the resistor material 104 from the side etch effect.

In a step illustrated in FIG. 2E, the protective film 110 having a thickness of about 200 Å, for example, is formed on the underlying insulating film 103 by the CVD method. Specifically, in this example, a parallel plate plasma CVD apparatus is used under a condition of RF (radio frequency) power of 200 W, pressure of 3.5 Torr, electrode temperature of 360 degree celsius, $N_2$ gas flow rate of 700 sccm, $SiH_4$ gas flow rate of 30 sccm, electrode distance of 450 mils and deposition time of 8.5 seconds.

Thereafter, a passivation layer is formed so as to protect the entire surface of semiconductor device 101. The passivation layer may be an interlaying insulating layer preferably made of an oxide film, or a film with a two-layer structure of a PSG film and a plasma nitride film.

Thus, the protective film 110 can sufficiently protect the thin film resistor 105 from being exposed to the atmosphere in the passivation layer forming process.

Figure 3A:
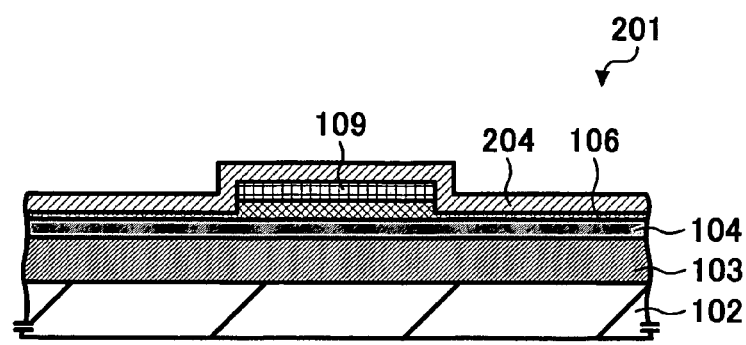
FIGS. 3A to 3D are cross-sectional views illustrating partial steps in a method for manufacturing a semiconductor device in a stepwise manner according to a second embodiment of the present invention.
Figure 3B:
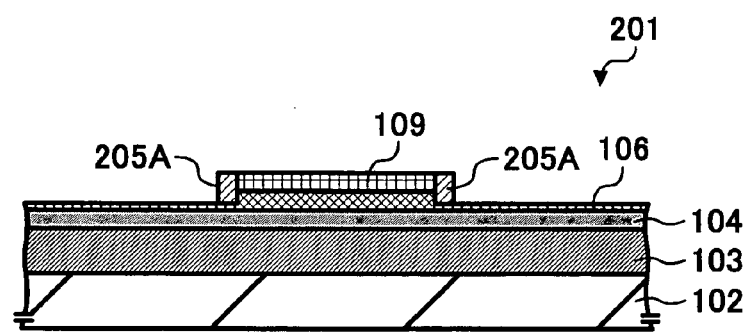
Figure 3C:
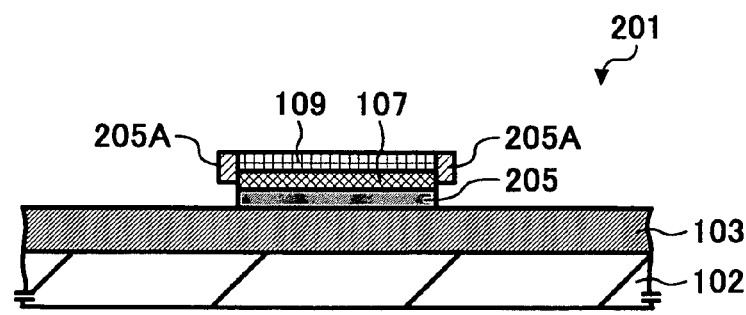
Figure 3D:
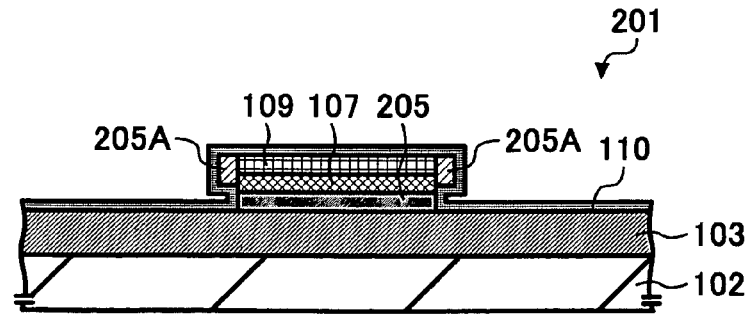

FIG. 3D illustrates a section of a semiconductor device 201 including a thin film resistor 205 according to a second embodiment of the present invention. In comparison with the semiconductor device 101, second metal side walls 205A, preferably made of a silicon oxide film, are formed so as to cover an upper side surface of the metal film 107 and the side surface of the oxide film 109. The protective film 110 protects the second metal side walls 205A such that an oxide film is not formed, at least not substantially, between the protective film 110 and the second metal side walls 205A. Thus, manufacture of the semiconductor device 201 can provide a consistent resistance value.

Next, a method for manufacturing the thin film resistor 205 of the semiconductor device 201 is explained with reference to FIGS. 3A to 3D.

In a step illustrated in FIG. 3A, after performing the steps described referring to FIGS. 2A and 2B, a second metal film 204, preferably a silicon oxide film having a thickness of about 200 Å, is formed by the CVD method, the sputtering method, and the like. In this example, the CVD method is preferably used.

Next, in a step illustrated in FIG. 3B, chemical dry etching is applied to the second metal film 204 with the oxide pattern 109 as an etching mask by using, for example, a mixed gas including $CF_4$ and $CHF_3$ as etchant to form the second metal side walls 205A.

Subsequently, in a step illustrated in FIG. 3C, the first metal film 106 and the resistor material 104 are patterned by using the oxide pattern 109 and the second metal side walls 205 as an etching mask to form the metal pattern 107 and the thin film resistor 205, respectively.

In this example, chemical dry etching is performed by a chemical dry etcher under a condition similar to the condition described referring to FIG. 2D. However, with the second metal side walls 205A, the oxide pattern 109, the metal pattern 107, and the thin film resistor 205 are formed in similar horizontal widths even when the side etch effect occurs.

In a step illustrated in FIG. 3D, the protective film 110 is formed on the underlying insulating film 103 in a similar manner as described above referring to FIG. 2E.

According to the second embodiment, the horizontal width of the thin film resistor 205 can be controlled based on the horizontal width of the second metal side walls 205A, i.e., the thickness of the second metal film 204. Thus, the thin film resistor 205 can be formed with a high feature resolution.

Figure 4A:
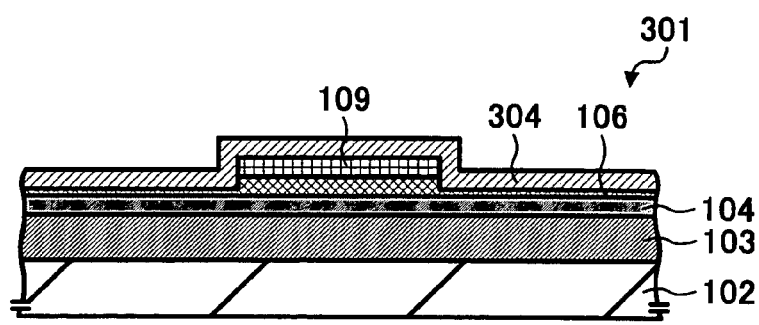
FIGS. 4A to 4D are cross-sectional views illustrating partial steps in a method for manufacturing a semiconductor device in a stepwise manner according to a third embodiment of the present invention.
Figure 4B:
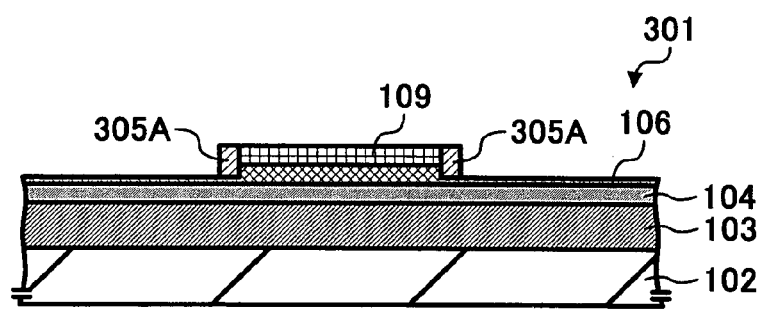
Figure 4C:
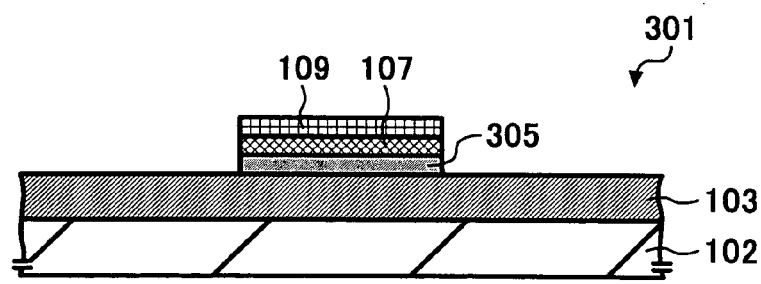
Figure 4D:
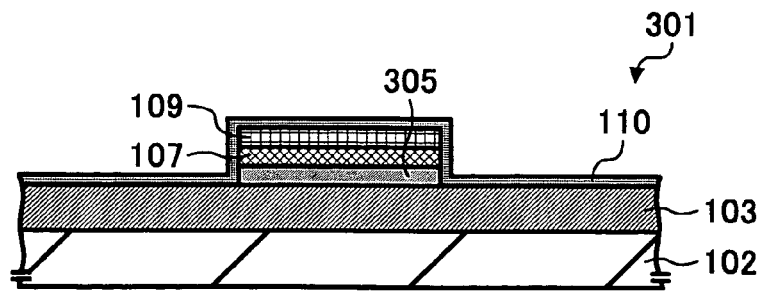

FIG. 4D illustrates a section of a semiconductor device 301 including a thin film resistor 305 according to a third embodiment of the present invention. In comparison with the semiconductor device 101, the oxide pattern 109 has a horizontal width substantially equal to the horizontal width of the metal pattern 107.

Next, a method for manufacturing the thin film resistor 305 of the semiconductor device 301 is explained referring to FIGS. 4A to 4D.

In a step illustrated in FIG. 4A, after performing the steps described referring to FIGS. 2A to 2C, a third metal film 304, preferably an amorphous silicon film having a thickness of about 200 Å, is formed by the CVD method, the sputtering method, and the like. In this example, the CVD method is preferably used.

Next, in a step illustrated in FIG. 4B, chemical dry etching is applied to the third metal film 304 by using, for example, a mixed gas including HBr (hydrogen bromide) and $Cl_2$ as an etchant to form third metal side walls 305A, in a similar manner as described above referring to FIG. 3B.

Subsequently, in a step illustrated in FIG. 4C, the first metal film 106 and the resistor material 104 are patterned by using the metal pattern 109 and the third metal side walls 305A as an etching mask to form the metal pattern 107 and the thin film resistor 305, respectively. In this example, chemical dry etching is performed by a chemical dry etcher under a condition similar to the condition described referring to FIG. 2D. However, the third metal side walls 305A are also removed in the etching process.

In a step illustrated in FIG. 4D, the protective film 110 is formed on the underlying insulating film 103 in a similar manner as described above referring to FIG. 2E.

According to the third embodiment, the horizontal width of the thin film resistor 305 can be controlled based on the horizontal width of the third metal side walls 305A, i.e., the thickness of the third metal film 305. Further, the third metal side walls 305A can be easily removed in the process.

Figure 5A:
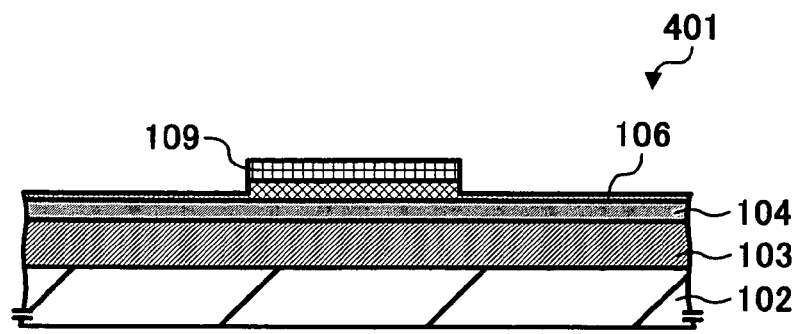
FIGS. 5A to 5C are cross-sectional views illustrating partial steps in a method for manufacturing a semiconductor device in a stepwise manner according to a fourth embodiment of the present invention.
Figure 5B:
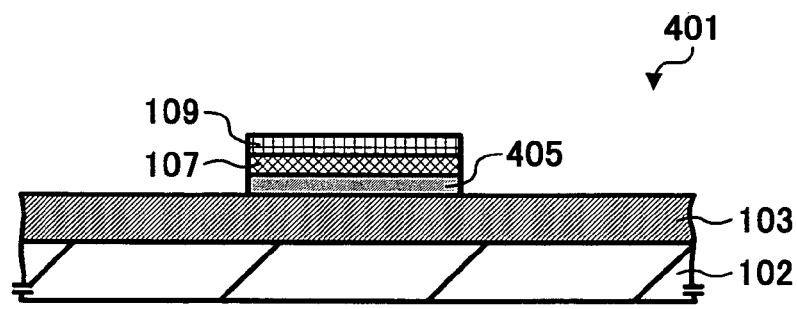
Figure 5C:
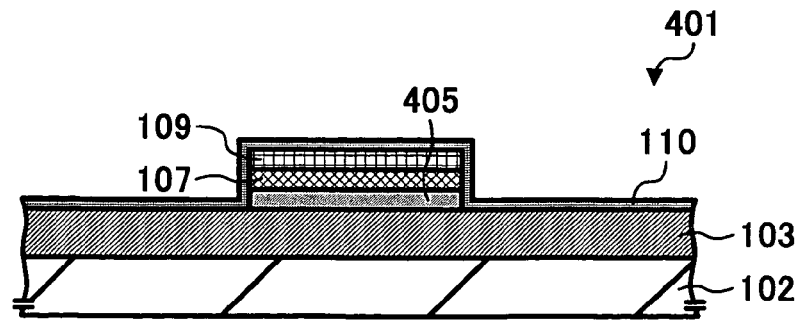

FIG. 5C illustrates a section of a semiconductor device 401 including a thin film resistor 405 according to a fourth embodiment of the present invention. The semiconductor device 401 has a structure substantially similar to the structure of the semiconductor device 301. Thus, a description of the structure thereof is omitted.

The thin film resistor 405 of the semiconductor device 401 is manufactured in several steps as illustrated in FIGS. 5A to 5C.

In a step illustrated in FIGS. 5A and 5B, after performing the steps described above referring to FIGS. 2A to 2C, the first metal film 106 and the resistor material 104 are sequentially patterned by the AR sputtering method under a condition of RF power of 1650V, DC bias of 300V, Ar gas flow rate of 20 sccm, and pressure of 7.3 mTorr.

Alternatively, in this step, the first metal film 106 and the resistor material 104 may be sequentially patterned by the RIE method, for example, by using a mixed gas including Ar, $CHF_3$, and $CF_4$ under a condition of RF power of 700 W, Ar gas flow rate of 800 sccm, $CHF_3$ gas flow rate of 50 sccm, and $CF_4$ gas flow rate of 50 sccm.

Since both the sputtering method and the RIE method are isotropic, the thin film resistor 405 having a horizontal width substantially equal to the horizontal width of the oxide pattern 109 can be formed.

Further, in this example, the oxide pattern 109 being used as an etching mask may be etched partially or completely, however, the first metal film 106 can sufficiently protect the resistor material 104 from being exposed to the atmosphere.

In a step illustrated in FIG. 5C, the protective film 110 is then formed on the underlying insulating film 103 in a similar manner as described above referring to FIG. 2E.

Figure 6:
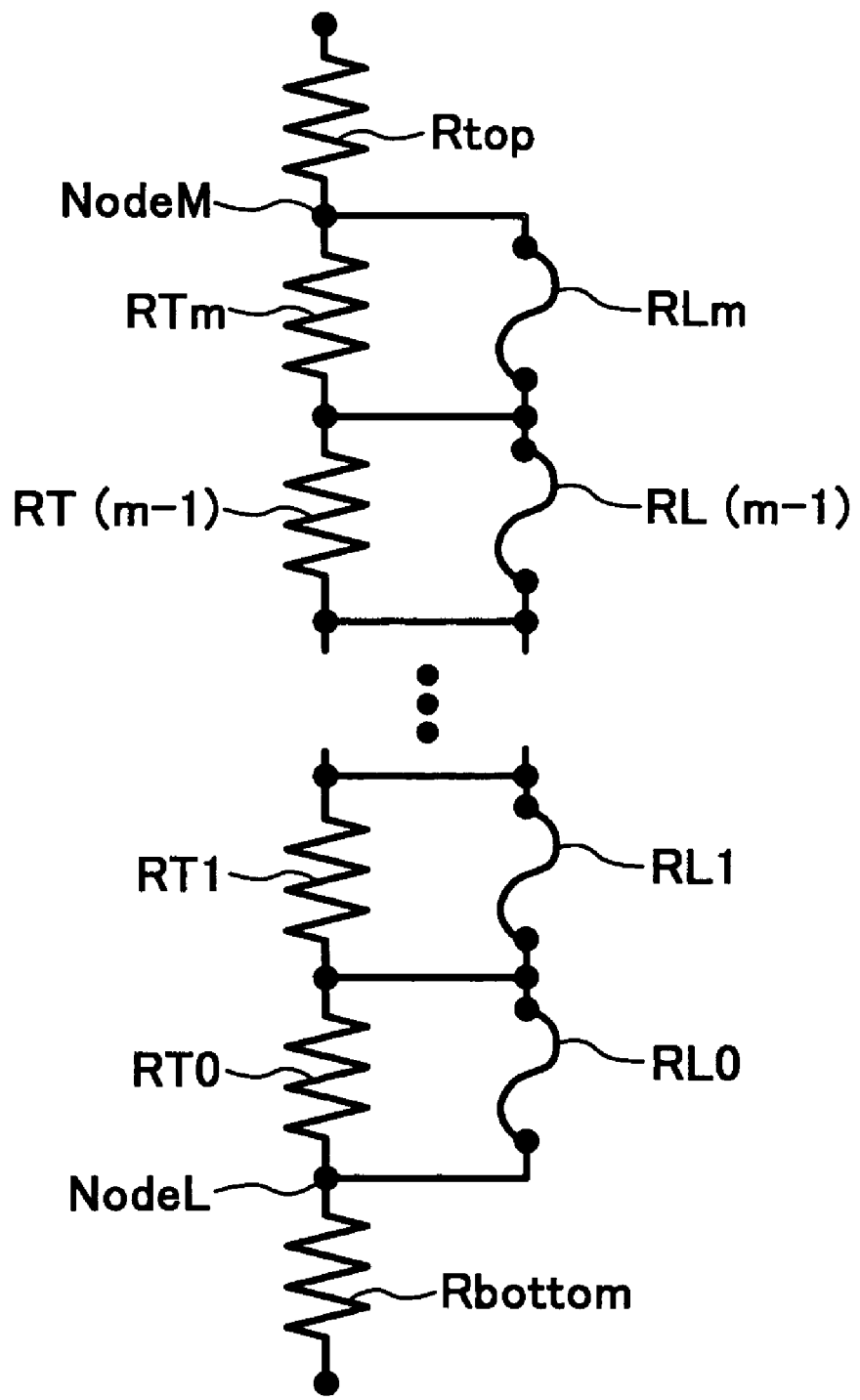
FIG. 6 is a circuit diagram illustrating an integrated circuit including a semiconductor device according to a preferred embodiment of the present invention.

The semiconductor device according to at least one of the above-described or other embodiments can be integrated in an integrated circuit, such as a divided resistor circuit illustrated in FIG. 6. The divided resistor circuit of FIG. 6 includes a resistor Rbottom, a resistor Rtop, and a plurality of resistors RT0 to RTm, where m is a positive integer. These resistors are all connected in series. Further, the resistors RT0 to RTm are connected in parallel to respective fusing elements RL0 to RLm. In this example, each of the resistors RT0 to RTm includes a thin film resistor 5a of FIG. 8, which has a structure substantially similar to the structure of a semiconductor device according to at least one of the above-described or other embodiments. The divided resistor circuit of FIG. 6 further includes a terminal NodeL provided between the resistor Rbottom and the resistor RT0, and a terminal NodeM provided between the resistor Rtop and the resistor RTm.

Figure 7:
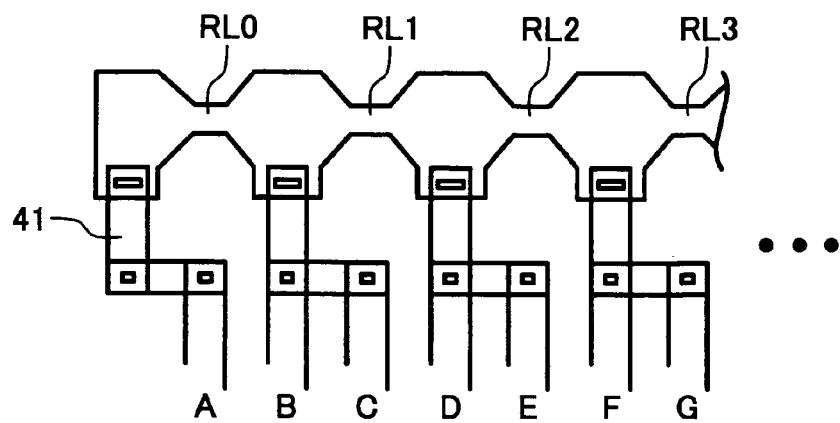
FIG. 7 is a circuit diagram illustrating a part of the integrated circuit of FIG. 6.
Figure 8:
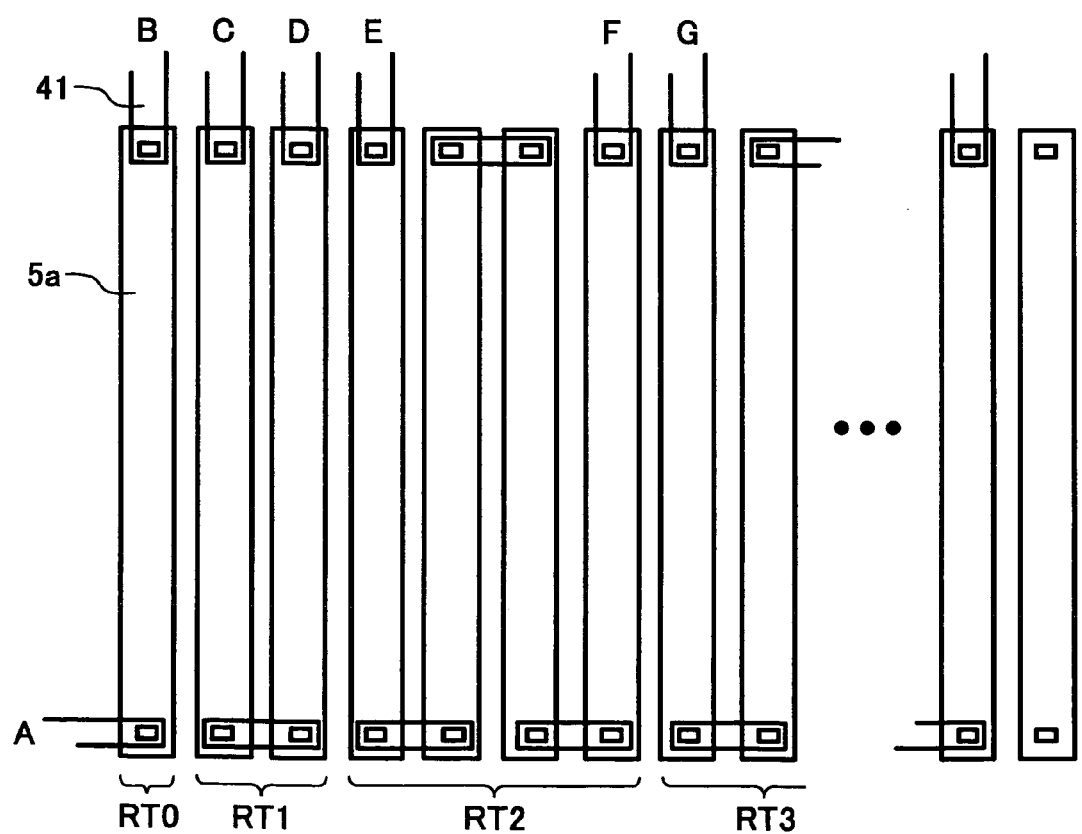
FIG. 8 is a circuit diagram illustrating another part of the integrated circuit of FIG. 6.

FIG. 7 and FIG. 8 illustrate layout structures of a fusing element section and a resistor section of FIG. 6, respectively. Points A to G of FIG. 7 are electrically connected to respective points A to G of FIG. 8 via a wiring layer 41.

Each of the fusing elements RL0 to RLm of FIG. 7 is formed of, for example, a polysilicon film having a sheet resistance value of 20 to 40 ohms. The resistors RT0 to RTm of FIG. 8 have resistance values which increase in a binary system based on a resistance value of the resistor RT0. For example, the resistor RTm has a resistance value (mth power of 2) of the resistance value of the resistor RT0.

In the divided resistor circuit of FIG. 6, at least one of the fusing elements RL0 to RLm is cut off by a laser beam so as to obtain a desired resistance value.

Figure 9:
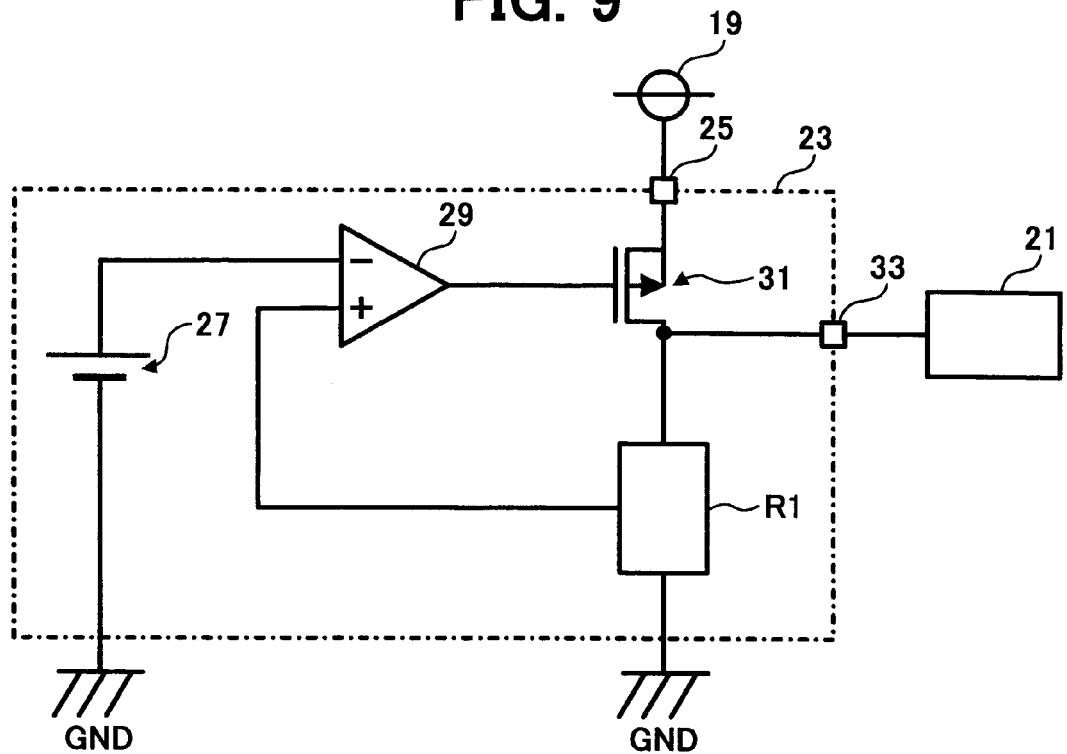
FIG. 9 is a circuit diagram illustrating an integrated circuit including a semiconductor device according to another embodiment of the present invention.
Figure 10:
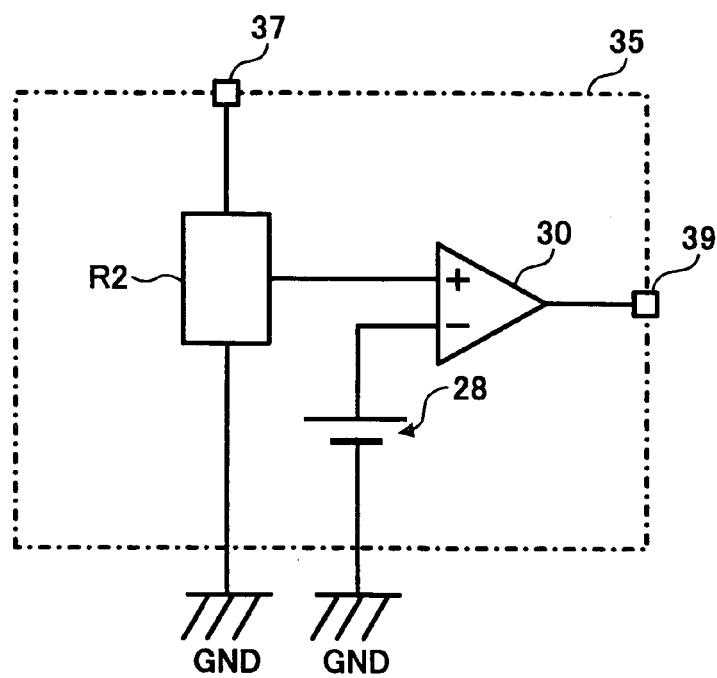
FIG. 10 is a circuit diagram illustrating an integrated circuit including a semiconductor device according to another embodiment of the present invention.

The divided resistor circuit of FIG. 6 may be further integrated in an integrated circuit such as a voltage regulating circuit 23 of FIG. 9 or a voltage detecting circuit 35 of FIG. 10.

The voltage regulating circuit 23 stably supplies a voltage from a DC power supply 19 to a load 21, and includes an input terminal 25, a reference voltage generator 27, an amplifier 29, a MOS transistor 31, a resistor R1 including the divided resistor circuit of FIG. 6, and an output terminal 33.

The amplifier 29 has a negative input terminal for receiving a reference voltage generated from the reference voltage generator 27, a positive input terminal for receiving a divided voltage generated by the resistor R1, and an output terminal for outputting an output voltage to a gate electrode of the MOS transistor 31.

The resistor R1 has a terminal of the resistor Rtop connected to a drain of the MOS transistor 31, and a terminal of the resistor Rbottom connected to the ground. Further, the positive input terminal of the amplifier 29 is connected to the terminals NodeL and NodeM of the resistor R1.

In the voltage regulating circuit 23, the reference voltage fluctuates depending on various conditions of the circuit. To produce voltage regulating circuits with consistent output voltages, the resistor R1 establishes the divided voltage by adjustments to the resistance value of each circuit.

In another example, the voltage detecting circuit 35 of FIG. 7 includes an amplifier 30, a reference voltage generator 28, an input terminal 37, a resistor R2 including the divided resistor circuit of FIG. 6, and an output terminal 39.

The amplifier 30 has a negative input terminal for receiving a reference voltage from the reference voltage generator 28, a positive input terminal for receiving a divided voltage generated by the resistor R2, and an output terminal for outputting an output voltage to the output terminal 39.

The resistor R2 receives a detected voltage from the input terminal 37, and generates the divided voltage based on the detected voltage. The resistor R2 has a terminal of the resistor Rtop connected to the input terminal 37, and a terminal of the resistor Rbottom connected to the ground. Further, the positive input terminal of the amplifier 30 is connected to the terminals NodeL and NodeM of the resistor R.

In the voltage detecting circuit 35, when the detected voltage is high such that the divided voltage is higher than the reference voltage, the resistor R2 causes the amplifier 30 to output the output voltage at a high level. On the other hand, when the detected voltage is low such that the divided voltage is lower than the reference voltage, the resistor R2 causes the amplifier 30 to output the output voltage at a low level.

The present invention has been described in conjunction with the above exemplary embodiments and it should be noted that this patent specification is not limited to these embodiments and that various modifications and variations may be made without departing from the scope and the spirit of the invention.

For example, the semiconductor device including the thin film resistor of this patent specification may be applied widely to any integrated circuit in addition to the above exemplary integrated circuits.

Additionally, numerous additional methods or conditions for thin film forming or etching may be applied to form the thin film resistor or the semiconductor device of this patent specification. Accordingly, the thickness of the thin film disclosed in this patent specification varies depending on such method or conditions.

What is claimed as new and desired to be protected by Letters Patent of the United States is:

1. A semiconductor device comprising:
   a substrate section;
   a metal thin film resistor formed on the substrate section;
   a patterned layer formed on the surface of the metal thin film resistor, the patterned layer having a horizontal width equal to a horizontal width of the metal thin film resistor;
   a patterned oxide layer formed on the patterned layer; and
   a nitride protective film covering and in direct contact with each of the metal thin film resistor, the patterned layer and the patterned oxide layer, wherein the patterned layer and the nitride protective film prevent formation of an oxide film on the metal thin film resistor.

2. The semiconductor device of claim 1, wherein the nitride protective film prevents formation of an oxide film on a side surface of the metal thin film resistor.

3. The semiconductor device of claim 1, wherein the substrate section includes a silicon substrate coated with a silicon oxide film.

4. The semiconductor device of claim 1, wherein the metal thin film resistor includes a thin film made of a material selected from NiCr, TaN, $CrSi_2$, CrSiN, CrSi and CrSiO.

5. The semiconductor device of claim 1, wherein the patterned oxide layer includes silicon oxide.

6. The semiconductor device of claim 1, wherein the nitride protective film includes plasma nitride.

7. The semiconductor device of claim 1, wherein the patterned oxide layer has a horizontal width larger than the horizontal width of the patterned layer.

8. The semiconductor device of claim 1, further comprising a side wall section provided between a side surface of the patterned oxide layer and a corresponding surface of the nitride protective film.

9. The semiconductor device of claim 8, wherein the side wall section includes a silicon oxide.

10. The semiconductor device of claim 8, wherein the side wall section includes an amorphous silicon.

11. The semiconductor device of claim 1, wherein the metal thin film resistor has opposing side edges, and the nitride protective film covers the opposing side edges.

12. The semiconductor device of claim 11, wherein the nitride protective film contacts the opposing side edges.

13. The semiconductor device of claim 1, wherein the patterned layer includes SiN.

14. A semiconductor device comprising:
   a substrate section;
   a metal thin film resistor formed on the substrate section;
   a patterned layer formed on the metal thin film resistor;
   a patterned oxide layer formed on the patterned layer; and
   a nitride protective film covering and in direct contact with each of the metal thin film resistor, the patterned layer and the patterned oxide layer, wherein the patterned layer and the nitride protective film prevent formation of an oxide film on the metal thin film resistor, and
   wherein the patterned layer has a horizontal width sufficient to prevent formation of an oxide film between an upper surface of the metal thin film resistor and a bottom surface of the patterned layer.

15. A semiconductor device comprising:
   a substrate section;
   a metal thin film resistor formed on the substrate section;
   a patterned layer including SiN formed on the metal thin film resistor;
   a patterned oxide layer formed on the patterned layer; and
   a nitride protective film covering and in direct contact with each of the metal thin film resistor, the patterned layer and the patterned oxide layer, wherein the patterned layer and the nitride protective film prevent formation of an oxide film on the metal thin film resistor.

* * * * *